US009038269B2

(12) United States Patent
Nystrom et al.

(10) Patent No.: US 9,038,269 B2
(45) Date of Patent: May 26, 2015

(54) PRINTHEAD WITH NANOTIPS FOR NANOSCALE PRINTING AND MANUFACTURING

(71) Applicant: XEROX CORPORATION, Norwalk, CT (US)

(72) Inventors: Peter J. Nystrom, Webster, NY (US); Andrew W. Hays, Fairport, NY (US); Bijoyraj Sahu, Gainesville, FL (US)

(73) Assignee: XEROX CORPORATION, Norwalk, CT (US)

( * ) Notice: Subject to any disclaimer, the term of this patent is extended or adjusted under 35 U.S.C. 154(b) by 132 days.

(21) Appl. No.: 13/855,105

(22) Filed: Apr. 2, 2013

(65) Prior Publication Data

US 2014/0295064 A1    Oct. 2, 2014

(51) Int. Cl.
*B41J 2/16*   (2006.01)
*B41J 2/14*   (2006.01)

(52) U.S. Cl.
CPC ............ *B41J 2/14282* (2013.01); *B41J 2/1614* (2013.01); *B41J 2202/03* (2013.01); *B41J 2202/11* (2013.01)

(58) Field of Classification Search
CPC ..... B41J 2/14282; B41J 2/1614; Y10T 29/42; Y10T 29/41; Y10T 29/49401
USPC ......... 29/890.1, 25.35, 25.01; 438/21, 50–53; 427/100, 98.4
See application file for complete search history.

(56) References Cited

U.S. PATENT DOCUMENTS

| | | | | |
|---|---|---|---|---|
| 5,051,379 A * | 9/1991 | Bayer et al. | ........................ | 216/2 |
| 5,066,358 A * | 11/1991 | Quate et al. | ........................ | 216/2 |
| 5,221,415 A * | 6/1993 | Albrecht et al. | .................. | 216/2 |
| 5,282,924 A * | 2/1994 | Bayer et al. | ........................ | 216/2 |
| 5,618,760 A * | 4/1997 | Soh et al. | ........................ | 438/703 |
| 5,811,017 A * | 9/1998 | Matsuyama | ..................... | 216/11 |
| 5,994,160 A * | 11/1999 | Niedermann et al. | .......... | 438/53 |
| 6,059,982 A * | 5/2000 | Palagonia et al. | ................ | 216/11 |
| 6,072,190 A * | 6/2000 | Watanabe et al. | ................ | 257/48 |
| 6,255,126 B1 * | 7/2001 | Mathieu et al. | ................... | 438/15 |
| 6,475,822 B2 * | 11/2002 | Eldridge et al. | .................. | 438/52 |
| 6,630,367 B1 * | 10/2003 | Kubena et al. | ................... | 438/48 |
| 6,743,211 B1 * | 6/2004 | Prausnitz et al. | ............. | 604/239 |
| 6,982,185 B2 * | 1/2006 | Kubena et al. | ................... | 438/52 |
| 7,371,072 B2 * | 5/2008 | Mathieu et al. | .................. | 439/66 |
| 7,393,713 B2 * | 7/2008 | Kim et al. | ........................ | 438/52 |
| 7,541,219 B2 * | 6/2009 | Milligan et al. | .............. | 438/117 |
| 7,550,311 B2 * | 6/2009 | Kim et al. | ........................ | 438/52 |
| 7,615,398 B2 * | 11/2009 | McKenzie et al. | .............. | 438/65 |
| 7,678,587 B2 * | 3/2010 | Kim et al. | ........................ | 438/14 |
| 7,691,661 B2 * | 4/2010 | Minne | ............................... | 438/52 |
| 7,700,962 B2 * | 4/2010 | McKenzie et al. | .............. | 257/95 |

(Continued)

*Primary Examiner* — Peter DungBa Vo
*Assistant Examiner* — Kaying Kue
(74) *Attorney, Agent, or Firm* — MH2 Technology Law Group LLP

(57) ABSTRACT

A nanoprinthead including an array of nanotip cantilevers, where each nanotip cantilever includes a nanotip at an end of a cantilever, and a method for forming the nanoprinthead. Each nanotip may be individually addressable through use of an array of piezoelectric actuators. Embodiments for forming a nanoprinthead including an array of nanotip cantilevers can include an etching process from a material such as a silicon wafer, or the formation of a metal or dielectric nanotip cantilever over a substrate. The nanoprinthead may operate to provide uses for technologies such as dip-pen nanolithography, nanomachining, and nanoscratching, among others.

6 Claims, 5 Drawing Sheets

(56) References Cited

U.S. PATENT DOCUMENTS

| | | | |
|---|---|---|---|
| 7,723,143 B2* | 5/2010 | Kim et al. | 438/50 |
| 7,841,863 B2* | 11/2010 | Mathieu et al. | 439/66 |
| 2002/0089343 A1* | 7/2002 | Khoury et al. | 324/754 |
| 2002/0142509 A1* | 10/2002 | Hattori et al. | 438/52 |
| 2004/0026007 A1* | 2/2004 | Hubert et al. | 156/64 |
| 2004/0056271 A1* | 3/2004 | Chen et al. | 257/152 |
| 2004/0097004 A1* | 5/2004 | Pogge et al. | 438/52 |
| 2004/0182707 A1* | 9/2004 | Jardemark et al. | 204/451 |
| 2004/0182820 A1* | 9/2004 | Motowaki et al. | 216/44 |
| 2005/0092709 A1* | 5/2005 | Chun et al. | 216/13 |
| 2006/0289954 A1* | 12/2006 | Bar-Sadeh et al. | 257/415 |
| 2007/0033993 A1* | 2/2007 | Fouchier | 73/105 |
| 2008/0000293 A1* | 1/2008 | Kitazawa et al. | 73/105 |
| 2008/0166878 A1* | 7/2008 | Li et al. | 438/704 |
| 2008/0223823 A1* | 9/2008 | Lee | 216/41 |
| 2008/0272299 A1* | 11/2008 | Jin et al. | 250/310 |
| 2009/0056094 A1* | 3/2009 | Shi et al. | 29/25.35 |
| 2009/0108183 A1* | 4/2009 | Bae et al. | 250/216 |
| 2009/0159996 A1* | 6/2009 | Chow et al. | 257/415 |
| 2010/0109688 A1* | 5/2010 | Eldridge et al. | 324/754 |
| 2010/0229265 A1* | 9/2010 | Jin et al. | 850/60 |
| 2012/0187076 A1 | 7/2012 | Dolan et al. | |
| 2012/0255932 A1* | 10/2012 | Tabib-Azar et al. | 216/63 |
| 2013/0190586 A1* | 7/2013 | Akingba et al. | 600/372 |
| 2013/0283922 A1* | 10/2013 | Qualtieri et al. | 73/774 |

* cited by examiner

PRINTHEAD WITH NANOTIPS FOR NANOSCALE PRINTING AND MANUFACTURING

FIELD OF THE EMBODIMENTS

The present teachings relate to the field of material deposition and printing and, more particularly, to a nanoprinthead including an array of nanotips and structures for actuation of the nanotips.

BACKGROUND

The ability to precisely deposit and pattern diverse materials such as metals, polymers, photoresists, conductive inks, etc., on a wide range of substrates at nanoscale dimensions (e.g., a feature size of 100 nm or less) is useful in a variety of technologies. For example, micro-images for security, biosensors, micro- and nano-sized lenses, plasmonic antennas, printed electronics, indentation, and other applications all benefit from nanoscale-sized patterns and features. Technologies such as dip-pen nanolithography, nanomachining using atomic force microscope (AFM) probe tips, and nanomachining have all been used to form patterned features for various uses.

Existing methods for forming nano-scale devices based on photolithographic processes such as e-beam lithography, ultraviolet (UV) lithography, x-ray lithography, and femtosecond laser machining are complex and expensive. Further, processes that provide self-assembly of printing structures are prone to variability and are not reproducible.

Different methods and structures that provide additional pattern formation alternatives would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment of the present teachings, a method for forming a nanoprinthead comprising a nanotip cantilever array including a plurality of nanotip cantilevers may include forming a patterned first mask having a first pattern over a first side of a substrate and a patterned second mask having a second pattern over a second side of the substrate, wherein the second side is opposite to the first side, etching the first side of the substrate using the first mask as a pattern to form a plurality of nanotips, etching the second side of the substrate using the second mask as a pattern, wherein the etching of the first side and the second side forms a plurality of bridges wherein each bridge comprises substrate material adjacent to each nanotip, and forming a sacrificial layer over the first side of the substrate, over the plurality of nanotips, and over the plurality of bridges. The method can further include etching the second side of the substrate to remove the plurality of bridges, to separate the substrate into a plurality of discrete structures held together by the sacrificial layer, and to form the nanotip cantilever array with each nanotip cantilever comprising a cantilever connected to the nanotip, and attaching the nanotip cantilever array to an array of actuation devices, wherein the array of actuation devices is configured to move each nanotip in a direction toward a surface to be contacted by the nanotip, and each nanotip cantilever of the nanotip cantilever array is individually addressable.

In another embodiment, a method for forming a nanoprinthead including a nanotip cantilever array including a plurality of nanotip cantilevers can include forming a patterned first mask comprising a first pattern over a surface of a substrate, etching a plurality of grooves within the surface of the substrate using the patterned first mask as a pattern, and removing the patterned first mask, forming a nanotip cantilever layer within the plurality of grooves and over the surface of the substrate, wherein the forming of the nanotip cantilever layer forms a plurality of nanotip cantilevers each comprising a nanotip within one of the plurality of grooves and a cantilever over the surface of the substrate, wherein the plurality of nanotip cantilevers are physically interconnected, and etching the nanotip cantilever layer to separate the plurality of nanotip cantilevers that are physically interconnected into a plurality of discrete nanotip cantilevers and to form the nanotip cantilever array. The method can further include attaching the nanotip cantilever array to an array of actuation devices, wherein the array of actuation devices is configured to move each nanotip in a direction toward a surface to be contacted by the nanotip, and each nanotip cantilever of the nanotip cantilever array is individually addressable, and releasing the plurality of discrete nanotip cantilevers from the substrate.

In another embodiment, a nanoprinthead can include a plurality of nanotip cantilevers, wherein each nanotip cantilever comprises a nanotip connected to a cantilever, a flexible diaphragm, wherein the plurality of nanotip cantilevers are physically connected to a first side of the flexible diaphragm, and a plurality of piezoelectric elements physically connected to a second side of the flexible diaphragm, and configured to move each nanotip in a direction toward a surface to be contacted by the nanotip upon activation of one of the plurality of piezoelectric elements.

In another embodiment of the present teachings, a method for forming an electrical circuit can include applying a voltage to at least one piezoelectric element of a piezoelectric element array to contact a surface with a nanotip that is part of a nanotip cantilever array of a nanoprinthead, and transferring a material from the at least one nanotip to the surface through physical contact between the material and the surface.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts.

Embodiments of the present teachings include nanoprinting structures, nanoindenting/nanoscratching structures, and methods for forming the nanoprinting and nanoindenting/nanoscratching structures. Embodiments of the present teachings can further include a method and structure for a nanotip cantilever array, and a method and structure for individually addressing each nanotip cantilever of the nanotip cantilever array. Methods for forming the various structures such as sharp nanotips can be accomplished using simplified techniques compared to some conventional manufacturing techniques. For purposes of the present disclosure, unless stated otherwise, a "nanoprinthead" is a marking device including an array of nanotip cantilevers as described below. The nanoprinthead can provide additive marking capabilities, for example by applying an ink, a dielectric layer, a conductive layer, etc., subtractive capabilities, for example by removing a portion of a layer through nanoscratching, or marking capabilities by nanoindenting or nanopunching a layer.

Figure 1A:
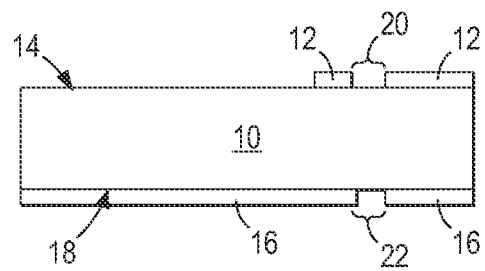
FIGS. 1A-1F are cross sections depicting an embodiment of the present teachings for forming one or more nanotip cantilevers.
Figure 1B:
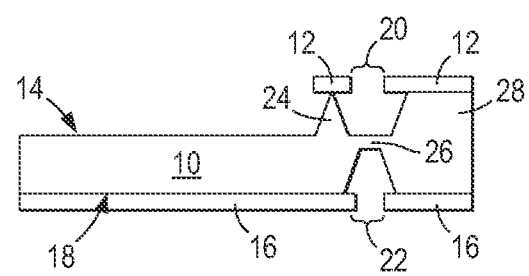

An embodiment of the present teachings can include a method for forming a nanoprinthead, specifically a nanoprinthead cantilever array as depicted in FIGS. 1A-1E. FIG. 1A depicts a starting substrate 10, for example a semiconductor wafer or wafer section that can be a silicon wafer as used with microelectronic manufacture. A patterned first mask 12 having a first pattern is formed on a first side or surface 14 of the substrate, and a patterned second mask 16 having a second pattern different than the first pattern is formed on a second side or surface 18 of the substrate 10 that is opposite to the first side 14 as depicted in FIG. 1A. A first opening 20 in the first mask 12 can generally align with a second opening 22 in the second mask 16 in a direction perpendicular to the first side 14 and the second side 18 of the substrate 10. The masks 12, 16 may be an oxide such as silicon dioxide ($SiO_2$) or another material that has a much slower etch rate than the material of the substrate 10 when exposed to a selected etchant.

After forming a structure similar to that depicted in FIG. 1A, the structure is exposed to an etch, for example a wet etch such as potassium hydroxide (KOH) or another wet or dry etchant that removes the substrate 10 at a much faster rate than it removes the masks 12, 16. This results in a structure similar to that depicted in FIG. 1B. This etch forms a nanotip 24, for example a silicon nanotip. In an embodiment, the pattern of masks 12, 16 can be repeated across the substrate 10 to form a nanotip array comprising a plurality of nanotips 24. During this etch, exposed portions of the first side 14 and the second side 18 are etched which forms a thin bridge 26 of substrate 10 material at a location adjacent to the nanotip 24 and between the nanotip 24 and a sacrificial portion 28 the substrate 10. At this point in the process, the substrate 10 remains as a continuous patterned layer that may include a plurality of nanotips 24.

Figure 1C:
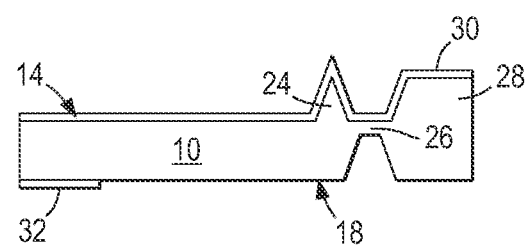

Next, as depicted in FIG. 1C, the masks 12, 16 are removed from the substrate 10, and a sacrificial layer 30 is formed over the first side 14 of the substrate 10. The sacrificial layer 30 is formed to a sufficient thickness to hold individual sections of the substrate 10 together during subsequent processing. The sacrificial layer 30 may be a conformal layer or a planar layer formed using any sufficient technique. In an embodiment, the sacrificial layer 30 may be a silicon nitride ($Si_3N_4$) layer having a thickness of between about 0.010 μm and about 2.0 μm, or between about 0.015 μm and about 1.0 μm, or between about 0.20 μm and about 0.500 μm. Other materials are also contemplated for the sacrificial layer 30, for example photoresist, silicon dioxide, chromium, aluminum, or other materials with a suitable etch selectivity that are compatible with processing.

As depicted in FIG. 1C, a patterned mask 32 may be formed on the second side 18 (the surface opposite the nanotip 24) as an option that will provide a bonding surface during subsequent processing as described below. The mask 32 may be the same material as the sacrificial layer 30, for example $Si_3N_4$, or a different material.

Figure 1D:
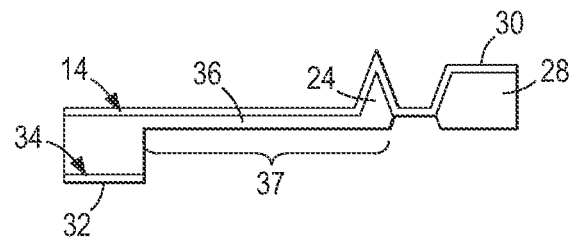

Next, the second side 18 is exposed to a vertical anisotropic etch to remove exposed portions of the second side 18 of the substrate 10 and, optionally, to form a bonding surface 34 as depicted in FIG. 1D. This etch also removes the bridge 26 (FIG. 1C) of substrate 10 material adjacent to the nanotip 24, and separates the substrate 10 into a plurality of discrete structures including one or more discrete nanotip 24 connected to one or more cantilever 36 (referred to together herein as a "nanotip cantilever 37") and one or more sacrificial portions 28 of the substrate. At this point, the different structures including the sacrificial portions 28 and the one or more cantilevers 36 are held together by the sacrificial layer 30.

Figure 1E:
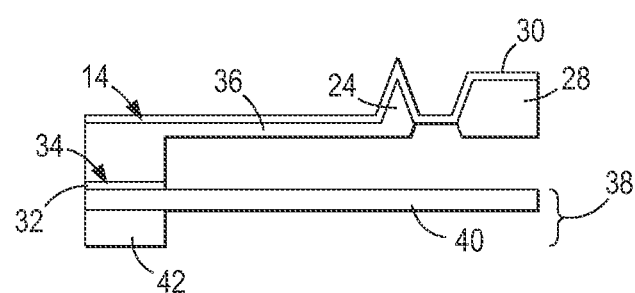

As depicted in FIG. 1E, each bonding surface 34 may be attached to an actuation device 38. The actuation device 38 is configured to move the nanotip in a direction toward a surface to be contacted by the nanotip. The actuation device 38 may include a flexible membrane or diaphragm 40 and a piezoelectric element 42 (i.e., PZT or piezoelectric transducer). Piezoelectric elements 42 as part of a piezoelectric element array are known in the art of ink jet printhead manufacture. For example, the formation of piezoelectric elements is described in U.S. Ser. No. 13/011,409, filed Jan. 21, 2011 and titled "Polymer Layer Removal on PZT Arrays Using a Plasma Etch," which is incorporated herein by reference in its entirety.

Figure 1F:
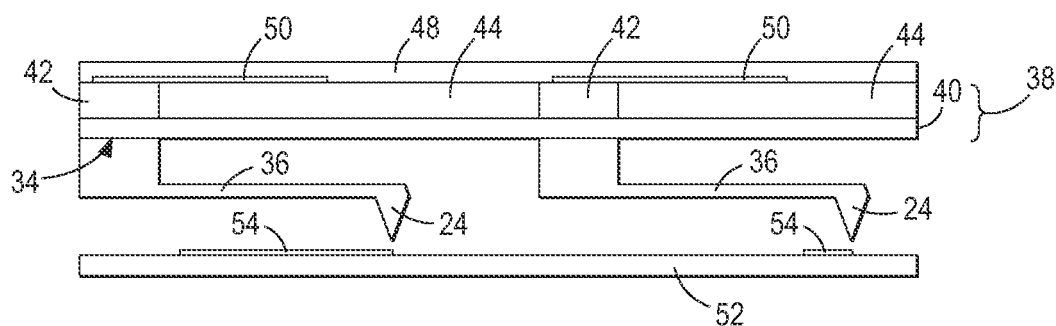

As depicted in FIG. 1E, the third mask 32 may remain on the bonding surface 34 when the bonding surface 34 is attached to the diaphragm 40. In another embodiment, the third mask 32 may be a different material than the sacrificial layer 30, and may be etched away prior to attachment of the bonding surface 34 to the diaphragm 40, for example as depicted in FIG. 1F. In either case, the bonding surface 34 may be attached to the diaphragm 40 using any sufficient adhesive (not individually depicted for simplicity) such as an epoxy or a thermoset. Once the nanotip cantilevers 37 are attached to the diaphragm, the sacrificial layer 30 may be etched away to leave at least one nanotip cantilever 37 attached to the diaphragm 30, and to remove the sacrificial portions 28 of the substrate 10.

As depicted in FIG. 1F, simultaneous processing of a plurality of nanotip cantilevers 37 to form a nanotip cantilever array can be performed. This results in a plurality of nanotip cantilevers 37 (which includes elements 24, 36) attached to a diaphragm 40 and to a plurality of piezoelectric elements 42. The nanotip cantilever array may be formed using the process of FIGS. 1A-1E, or a different process.

The completed structure of FIG. 1F can further include an interstitial dielectric material 44 interposed between each piezoelectric element 42, and an electrical circuit 48, for example a flexible printed circuit (i.e., flex circuit) or printed circuit board (PCB), having a plurality of conductive traces 50. Each trace 50 of the circuit 48 is electrically coupled with a conductive surface of one of the piezoelectric elements 42 such that each piezoelectric element 42 is individually addressable. Each trace 50 is electrically coupled to a voltage source.

Once a nanoprinthead including the nanotip cantilever array has been completed, it may be installed as part of a printer or marking system as depicted in FIG. 1F. In operation, a selected piezoelectric element 42 is activated by applying a voltage to the trace 50 attached to the selected piezoelectric element 42. The diaphragm 40 may function as a common bottom (ground) electrode for each piezoelectric element 42. Upon the application of the voltage, the activated piezoelectric element 42 bends or deflects, causing the diaphragm 40 to flex. Flexing of the diaphragm 40 at a location between a piezoelectric element 42 and a nanotip cantilever 37 attached to the diaphragm 40 causes movement of the nanotip cantilever 37 which, in turn, causes the nanotip 24 to move in a direction away from the diaphragm 40. A surface 52 to be printed or marked is loaded into the printer or marking system, and the printhead, including the nanotips 24, can descend into light contact with the surface 52. The nanotips 24 and printhead may then be lifted away from the surface 52 to establish a standby distance that may be based on the vertical distance the nanotip 24 travels during actuation of its associated piezoelectric element 42. Activating the actuation device 38 moves the nanotip 24 toward the surface 52, and thus the surface is physically contacted by the nanotip 24 during the application of a voltage to its associated piezoelectric element 42, and is not contacted by the nanotip 24 if no voltage is applied to the piezoelectric element 42. In an embodiment, the end of the nanotip 24 may dent or scratch a surface 52 or a coating on the surface 52 placed near the nanotip 24 during flexing of a piezoelectric element 42. In another embodiment, the end of the nanotip 24 may be dipped in a liquid material or a powder material, which is then dispensed or transferred to the surface 52 during flexing of an associated piezoelectric element 42 to form a layer 54.

In an embodiment, layer 54 may be, for example, an ink or pigment used to complete an image such as text, a pictorial image, or an encoded image on the surface 52. To form the image, coordinate image data may be supplied to the printer or marker by, for example, a digital device such as a processor. The coordinate image data is read by the printer or marker, which is then used by the device to move or scan the printhead over the surface 52 to an appropriate location. At the appropriate location, the piezoelectric element 42 is activated such that the nanotip 24 contacts the surface 52 and transfers the ink or powder 54 to the surface 52. As discussed above, the ink or powder 54 can be disposed onto the nanotip 24 by dipping the nanotip into a receptacle containing the ink or powder 54. In another embodiment, the ink or powder can be disposed onto the nanotip 24 by spraying or by using an electrostatic dispensing process.

Additionally, element 54 in FIG. 1F can represent a conductive or dielectric material that functions as a circuit component on a substrate surface 52 such as a printed circuit board. A piezoelectric element 42 may be activated such that the nanotip 24 contacts the substrate 52 to transfer the conductor or dielectric material from the nanotip 24 to the substrate 52 to form a patterned layer of material 54. In an embodiment, the material 54 may form one or more conductive traces and/or conductive pads that form part of an electric circuit. In another embodiment, the material 54 may provide a patterned dielectric layer that may be used, for example, as a mask to form a patterned conductive layer during a damascene deposition process. In an embodiment, the nanotip cantilever 37 including nanotip 24 and cantilever 36 can function as part of a 3D printer which uses the selective deposition of material to form a patterned conductive or dielectric structure.

It will be appreciated that the FIG. 1F structure may also represent a subtractive process where portions of conductive or dielectric layer 54 are scratched or scraped from the surface 52 using the actuated nanotips 24 to form a patterned structure 54.

In another embodiment, instead of scanning the nanotip 24 across the surface 52, the surface 52 itself may be moved so that the nanotip 24 overlies an appropriate location, then the piezoelectric element 42 is activated such that the nanotip 24 contacts the surface. In another embodiment, the nanotip 24 and the surface 52 may be a conductive material, so that physical contact between the nanotip 24 and the surface 52 establishes electrical contact therebetween to function, for example, as a probe tip. In embodiments, the nanotip 24 may be a conductor, a semiconductor, or a dielectric.

Figure 2A:
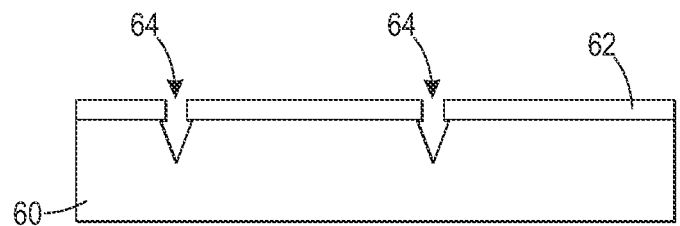
FIGS. 2A-2F are cross sections depicting another embodiment of the present teachings for forming one or more nanotip cantilevers.

Another embodiment for forming at least one nanotip cantilever, or a nanotip cantilever array comprising a plurality of nanotip cantilevers, is depicted in FIGS. 2A-2F. In FIG. 2A, a patterned first mask 62, such as a photoresist layer, is formed over a substrate 60, for example a semiconductor wafer such as a silicon wafer. An anisotropic etch such as a KOH wet etch is performed to undercut the first mask 62 and to form at least one, or a plurality of, "V" shaped or "U" shaped grooves 64 within the substrate 60 as depicted.

After etching the substrate 60, the first mask 62 is removed and an optional conformal release layer 66 is formed over the surface of the substrate 60, followed by a planar or nanotip cantilever layer 68. The optional conformal release layer 66 may be, for example, a polymer, while the nanotip cantilever layer 68 may be metal such as copper, a metal alloy, a dielectric such as $Si_3N_4$, or another suitable material depending on the intended use of the completed nanotip. The nanotip cantilever layer 68 is formed within the grooves and over the surface of the substrate 60 as depicted. In an embodiment, the nanotip cantilever layer 68 may be a material that releases from the substrate 60 such as a polymer, in which case a release layer 66 need not be used. In another embodiment, a metal or $Si_3N_4$ layer may be formed that releases from the substrate without the need for a release layer 66. In this embodiment, the formation of the nanotip cantilever layer 68 forms a plurality of nanotips and a plurality of cantilevers all physically interconnected (i.e., connected to form a continuous layer) as depicted in FIG. 2B.

Figure 2B:
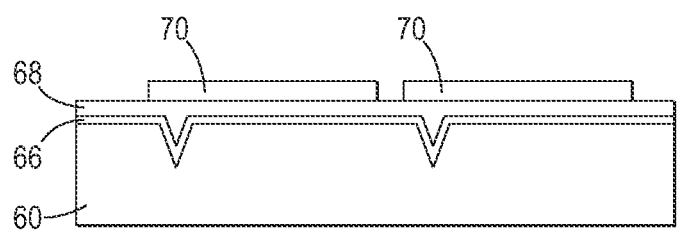
Figure 2C:
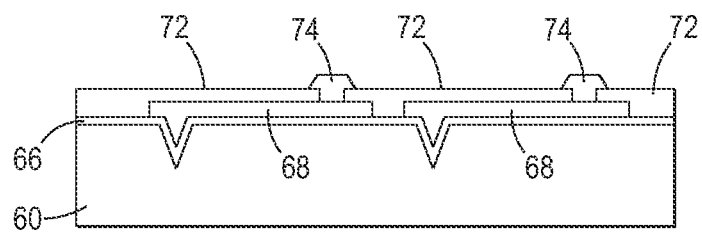
Figure 2D:
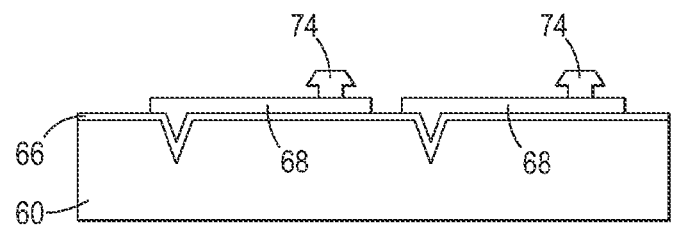

After forming the nanotip cantilever layer 68, a patterned second mask 70 as depicted in FIG. 2B is formed that will be used to define a length of each nanotip cantilever. An anisotropic vertical etch is performed on the FIG. 2B structure, specifically on the nanotip cantilever layer 68, to define the length of each nanotip cantilever and to separate the plurality of physically interconnected nanotip cantilevers into a plurality of discrete nanotip cantilevers as depicted in FIG. 2C. The release layer 66, if used, or the substrate 60 may be used as an etch stop layer. After etching, the patterned second mask 70 is removed.

Next, a patterned third mask 72 is formed which exposes an end of each nanotip cantilever 68. A plurality of supports 74 may then be formed, for example using the exposed portion of the nanotip cantilevers 68 as an electroplating seed layer during formation of the supports 74, with the openings in the patterned third mask 72 defining the location and shape of the supports 74. In another embodiment, a dielectric layer such as $Si_3N_4$ may be used as the supports 74 using a patterning process. If the supports 74 are formed using electroplating, a dielectric layer 76 (FIG. 2E), for example a polymer layer, may be formed to encapsulate each support 74 and to form a standoff layer for each nanotip cantilever, for example using a patterning process.

Figure 2E:
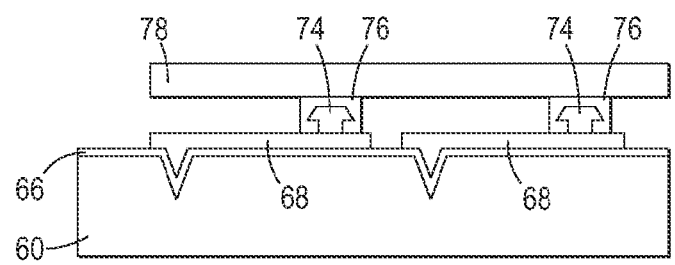

Next, a lift-off layer 78 may be attached to each standoff layer 76 as depicted in FIG. 2E. In an embodiment, the lift-off layer 78 may be a handle wafer that is used to transport and/or further process the nanotip cantilevers 68. In another embodiment, the lift-off layer 78 can include an actuation device 38 (FIG. 1F), for example an array of piezoelectric elements 42 and a flex circuit or PCB 48 having traces 50 electrically coupled to each piezoelectric element 42.

Figure 2F:
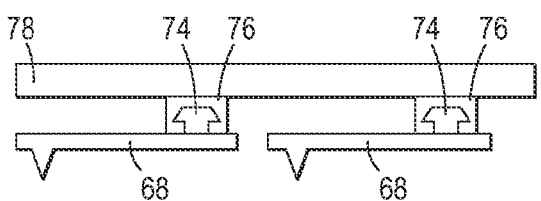
Figure 2F:
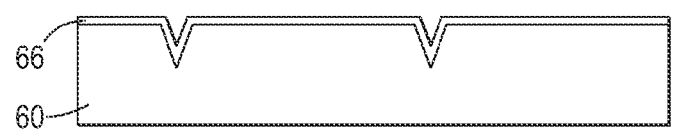

After attachment of the lift-off layer 78, the plurality of nanotip cantilevers 68 may be released from the substrate 60 as depicted in FIG. 2F. In an embodiment, the structure of FIG. 2E may be heated to soften the release layer 66 to facilitate release of the nanotip cantilevers 68 from the substrate 60. In another embodiment, differences in thermal coefficients of expansion between the nanotip cantilevers 68 and the substrate 60 are utilized to release the nanotip cantilevers 68 from the substrate 60 during a heating or cooling process without the use of a release layer.

Figure 3:
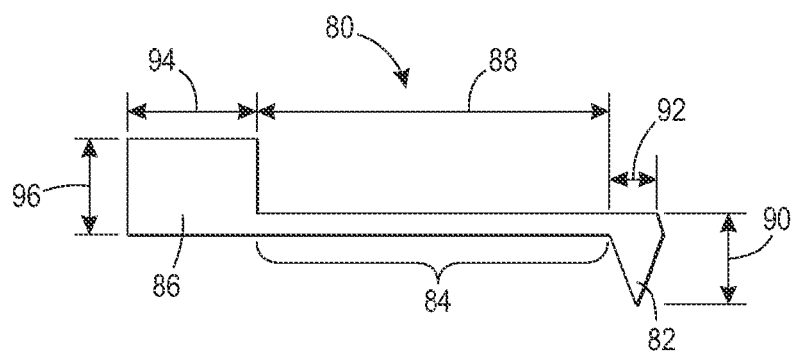
FIG. 3 is a cross section of a nanotip cantilever and an optional bonding surface in accordance with an embodiment of the present teachings.

Using an embodiment of the present teachings, and referring to FIG. 3, each nanotip cantilever 80 may include a nanotip 82 connected to a cantilever 84. The nanotip cantilever 80 may optionally be connected to a bonding surface 86. The cantilever 84 can have a length 88 of between about 80 μm and about 400 μm and a thickness of between about 2 μm and about 6.5 μm. The nanotip 82 may have a height 90 of between about 5 μm and about 25 μm and a width 92 of between about 20 μm and about 40 μm. The nanotip sharpness (tip radius) may be between 1 nanometer to 100 nm. The tip radius will depend upon the resolution of the nanostructure desired. The bonding surface 86, if used, may have a width 94 of between about 80 μm and about 450 μm and a height 96 of between about 200 nm and about 1 μm. It will be understood that the size of the features will depend on the use of the structure, and that dimensions outside the described ranges may be formed using an embodiment of the present teachings.

In an embodiment, referring back to FIG. 2F, the substrate 60 may be reused as a substrate for the formation of additional nanotip cantilevers 68. In an embodiment, the release layer 66 may also be reused, or the release layer 66 can be stripped and reformed for a subsequent production lot of nanotip cantilevers 68. Further, the lift-off 78 may also be reused.

Figure 4A:
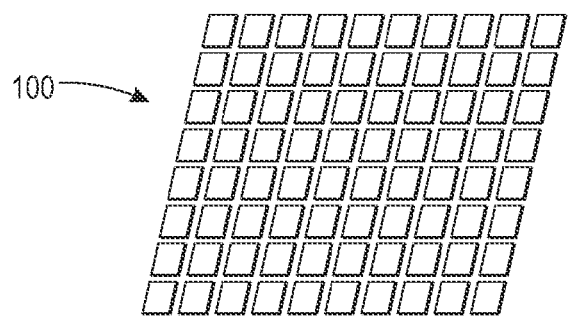
FIGS. 4A and 4B are perspective depictions of two different layouts of piezoelectric element subarrays in embodiments of the present teachings.
Figure 4B:
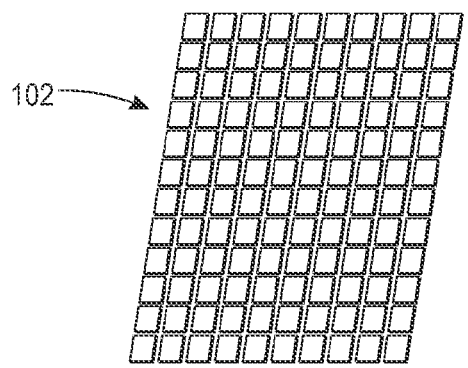

Exemplary piezoelectric element layouts are depicted in the isometric depictions of FIGS. 4A and 4B. FIG. 4A depicts an exemplary layout for a 600 dot per inch (dpi) piezoelectric element array (and thus a 600 dpi nanotip cantilever array) having a 600 μm pitch, while FIG. 4B depicts a layout for a 1200 dpi piezoelectric array (and thus a 1200 dpi nanotip cantilever array) having a 300 μm pitch.

It is contemplated that a plurality of modular subarrays such as those depicted in FIGS. 4A and 4B may be fabricated and assembled together to form an entire array. For example, FIG. 4A depicts an 8×10 subarray 100 which may be part of a 64×100 array of piezoelectric elements, and FIG. 4B depicts a 10×12 subarray 102 which may be part of a 400×80 array of piezoelectric elements. Any number of subarrays may be assembled to form a desired array, but maintaining planarity of the subarrays within the array becomes more difficult as array size increases. Each subarray 100, 102 may be an individual module that includes a piezoelectric element 42 (FIG. 1F) subarray, a subcircuit assembly such as a flex circuit or PCB 48 (FIG. 1F), and a nanotip cantilever 37 (FIG. 1D) subarray. If damage or wear occurred within the module, only the module itself may be replaced rather than requiring replacement of the entire array. Further, each module may be separately tested for proper functionality before assembly into the array, thus simplifying the manufacturing process. Further, testing a module before assembly may simplify rework.

It is contemplated that a nanotip 24 or cantilever 36 may become damaged during use. Detection of missing nanotips may be achieved through a variation of missing jet detection or self sensing as implemented by some piezoelectric ink jet printheads. Further, characterization, measurement, calibration, and qualification of cantilever operation may be established through methods based on optical interferometry. Optical interferometry, cantilever deflection sensors, and self-sensing can be used for feedback, and printer control electronics and motion can be used as drive controls for a printer or marker/marking system that includes a nanotip cantilever 37 in accordance with the present teachings.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming a nanoprinthead comprising a nanotip cantilever array including a plurality of nanotip cantilevers, the method comprising:
    forming a patterned first mask having a first pattern over a first side of a substrate and a patterned second mask having a second pattern over a second side of the substrate, wherein the second side is opposite to the first side;
    etching the first side of the substrate using the first mask as a pattern to form a plurality of nanotips;
    etching the second side of the substrate using the second mask as a pattern, wherein the etching of the first side and the second side forms a plurality of bridges wherein each bridge comprises substrate material adjacent to each nanotip;
    forming a sacrificial layer over the first side of the substrate, over the plurality of nanotips, and over the plurality of bridges;
    etching the second side of the substrate to remove the plurality of bridges, to separate the substrate into a plurality of discrete structures held together by the sacrificial layer, and to form the nanotip cantilever array with each nanotip cantilever comprising a cantilever connected to the nanotip; and
    attaching the nanotip cantilever array to an array of actuation devices, wherein the array of actuation devices is configured to move each nanotip in a direction toward a surface to be contacted by the nanotip, and each nanotip cantilever of the nanotip cantilever array is individually addressable.

2. The method of claim 1 wherein the separation of the substrate into the plurality of discrete structures comprises separating the nanotip from a sacrificial portion of the substrate.

3. The method of claim 1, wherein the attaching of the nanotip cantilever array to the array of actuation devices comprises attaching each nanotip cantilever to a flexible diaphragm, wherein the flexible diaphragm is attached to an array of piezoelectric elements that provide the array of actuation devices.

4. The method of claim 1, further comprising:
    forming a patterned third mask having a third pattern over the second side of the substrate subsequent to etching the second side of the substrate using the second mask as a pattern;
    etching the second side of the substrate using the patterned third mask as a pattern to form a plurality of bonding surfaces with each bonding surface connected to one of the nanotip cantilevers; and
    attaching each of the plurality of bonding surfaces to one of the plurality of actuation devices.

5. The method of claim 4, further comprising removing the patterned third mask prior to attaching the plurality of bonding surfaces to the plurality of actuation devices.

6. The method of claim 1 wherein the nanoprinthead is installed in a marking device, and the method further comprises marking a layer using the plurality of nanotips.

* * * * *